(12) United States Patent
Taylor

(10) Patent No.: US 7,529,529 B2
(45) Date of Patent: May 5, 2009

(54) LOW NOISE, HIGH-LINEARITY RF FRONT END RECEIVER

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 611 days.

(21) Appl. No.: 11/072,212

(22) Filed: Mar. 4, 2005

(65) Prior Publication Data
US 2006/0199562 A1 Sep. 7, 2006

(51) Int. Cl.
*H04B 1/26* (2006.01)
(52) U.S. Cl. .................. 455/130; 455/323; 455/333
(58) Field of Classification Search .......... 455/130, 455/137–141, 313, 316, 318–320, 323–326, 455/333–334, 337–341, 230
See application file for complete search history.

(56) References Cited

U.S. PATENT DOCUMENTS

| | | | | | |
|---|---|---|---|---|---|
| 5,589,791 | A | * | 12/1996 | Gilbert | 327/359 |
| 5,826,182 | A | * | 10/1998 | Gilbert | 455/326 |
| 6,023,196 | A | * | 2/2000 | Ashby et al. | 330/290 |
| 6,026,286 | A | * | 2/2000 | Long | 455/327 |
| 6,040,731 | A | * | 3/2000 | Chen et al. | 327/359 |
| 6,057,714 | A | * | 5/2000 | Andrys et al. | 327/105 |
| 6,073,002 | A | * | 6/2000 | Peterson | 455/326 |
| 6,094,084 | A | * | 7/2000 | Abou-Allam et al. | 327/359 |
| 6,094,571 | A | * | 7/2000 | Groe | 455/333 |
| 6,157,822 | A | * | 12/2000 | Bastani et al. | 455/323 |
| 6,230,001 | B1 | * | 5/2001 | Wyse | 455/326 |
| 6,591,093 | B1 | * | 7/2003 | Coffing et al. | 455/319 |
| 6,831,497 | B2 | * | 12/2004 | Koh et al. | 327/254 |
| 6,865,382 | B2 | * | 3/2005 | Behzad | 455/323 |
| 6,992,519 | B2 | * | 1/2006 | Vilander et al. | 327/359 |
| 7,054,609 | B2 | * | 5/2006 | Wiklund et al. | 455/323 |
| 7,263,344 | B2 | * | 8/2007 | Manku | 455/323 |
| 7,358,885 | B2 | * | 4/2008 | Maxim et al. | 341/144 |
| 2001/0021645 | A1 | * | 9/2001 | Ugajin et al. | 455/333 |
| 2003/0117200 | A1 | * | 6/2003 | Koh et al. | 327/238 |
| 2003/0148751 | A1 | * | 8/2003 | Yan et al. | 455/318 |
| 2004/0063418 | A1 | * | 4/2004 | Kluge et al. | 455/315 |
| 2004/0106380 | A1 | * | 6/2004 | Vassiliou et al. | 455/73 |
| 2004/0183599 | A1 | * | 9/2004 | Banba et al. | 330/254 |
| 2005/0124311 | A1 | * | 6/2005 | Mahmoudi et al. | 455/323 |
| 2005/0197090 | A1 | * | 9/2005 | Stockstad et al. | 455/313 |
| 2007/0077907 | A1 | * | 4/2007 | Rector | 455/323 |

* cited by examiner

*Primary Examiner*—Pablo N Tran
(74) *Attorney, Agent, or Firm*—Scott M. Lane

(57) ABSTRACT

An architecture for a receiver of a wireless device having a Low Noise Amplifier (LNA) transconductor to receive a signal from an antenna, a mixer meshed with the LNA transconductor, and an amplifier/filter meshed with the mixer to provide a baseband output signal.

15 Claims, 3 Drawing Sheets

LOW NOISE, HIGH-LINEARITY RF FRONT END RECEIVER

The proliferation of mobile devices necessitates a receiver operating in hostile Radio Frequency Interference (RFI) environments. Conventional receiver systems have signal paths that typically include a Low Noise Amplifier (LNA), two down-converters, variable-gain and fixed-gain amplifiers, and baseband filters. That receiver system utilizes a double-conversion superheterodyne architecture with external Surface Acoustic Wave (SAW) filters. Improvements in the receiver systems are needed to enhance receiver linearity, decrease power and reduce costs.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
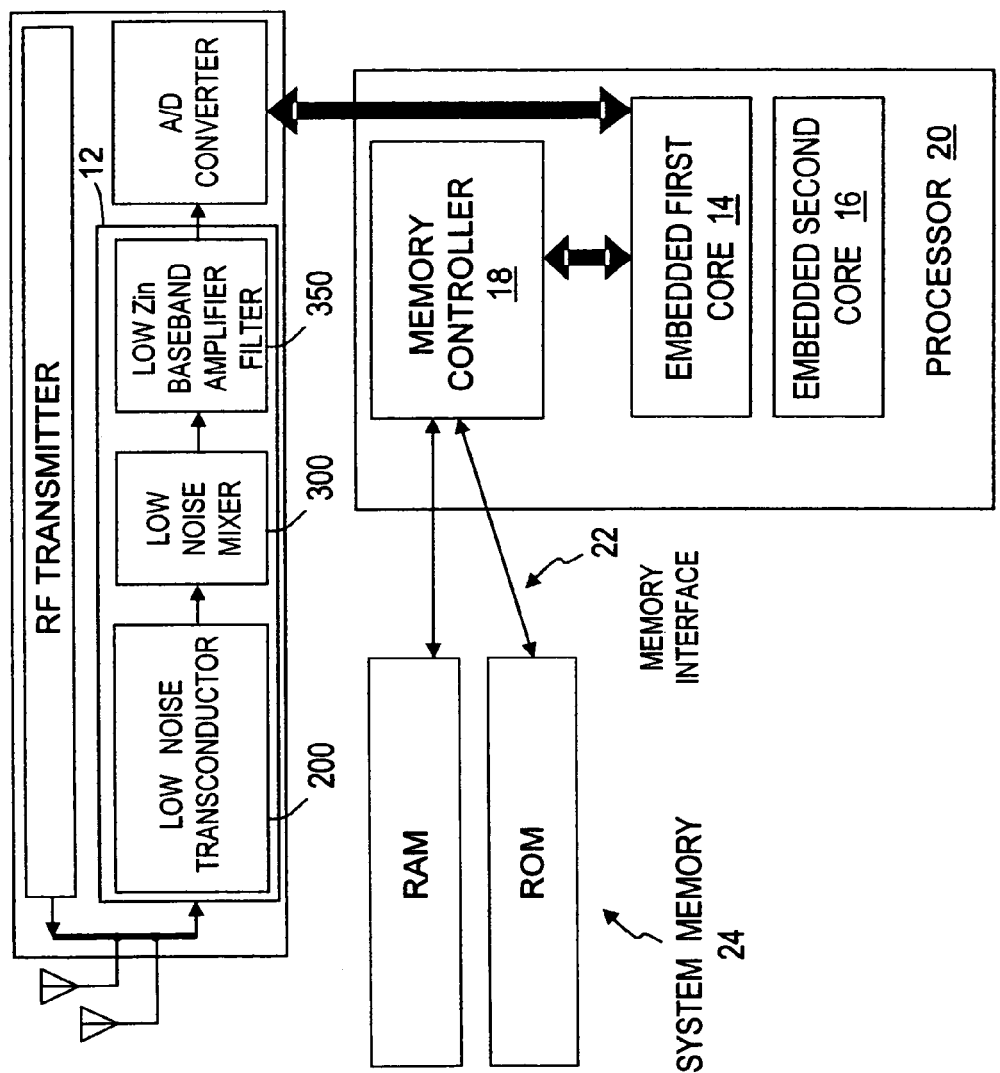
FIG. 1 is a block diagram illustrating a wireless device that incorporates a low-noise, high-linearity receiver front end in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

FIG. 1 illustrates features of the present invention that may be incorporated, for example, into a wireless device 10. In the wireless device a transceiver both receives and transmits a modulated signal from one or more antennas. The analog front end transceiver may be a stand-alone Radio Frequency (RF) integrated analog circuit, or alternatively, be embedded with a processor 20 as a mixed-mode integrated circuit. The received modulated signal may be frequency down-converted, filtered, then converted to a baseband signal in a receiver portion 12.

Processor 20 may include baseband and applications processing functions that utilize one or more processor cores. Processor cores 14 and 16, in general, process functions that fetch instructions, generate decodes, find operands, and perform appropriate actions, then store results. The use of multiple cores may allow one core to be dedicated to handle application specific functions such as, for example, graphics, modem functions, etc. Alternatively, the multiple cores may allow processing workloads to be shared across the cores.

A memory controller 18 controls a memory interface 22 that allows the processor cores and cache memory (not shown) embedded within processor 20 to exchange data with a system memory 24. System memory 24 may include a combination of memories such as a disc, a Random Access Memory (RAM), a Read Only Memory (ROM) and a non-volatile memory 26, although neither the type nor variety of memories included in system memory 24 are limitations of the present invention.

Embodiments of the present invention may be used in a variety of products, with the claimed subject matter incorporated into desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples. The incorporation of the embodiments of the present invention into the wireless products facilitates the implementation of low-cost, high-performance Complementary Metal Oxide Semiconductor (CMOS) receivers for Wireless Local Area Network (WLAN), WiFi™, Ultra-WideBand (UWB), cognitive radio, Global System for Mobile Communication and Enhanced Data rates for GSM Evolution (GSM/EDGE), and Wideband Code Division Multiple Access (WCDMA) systems, among others.

Figure 2:
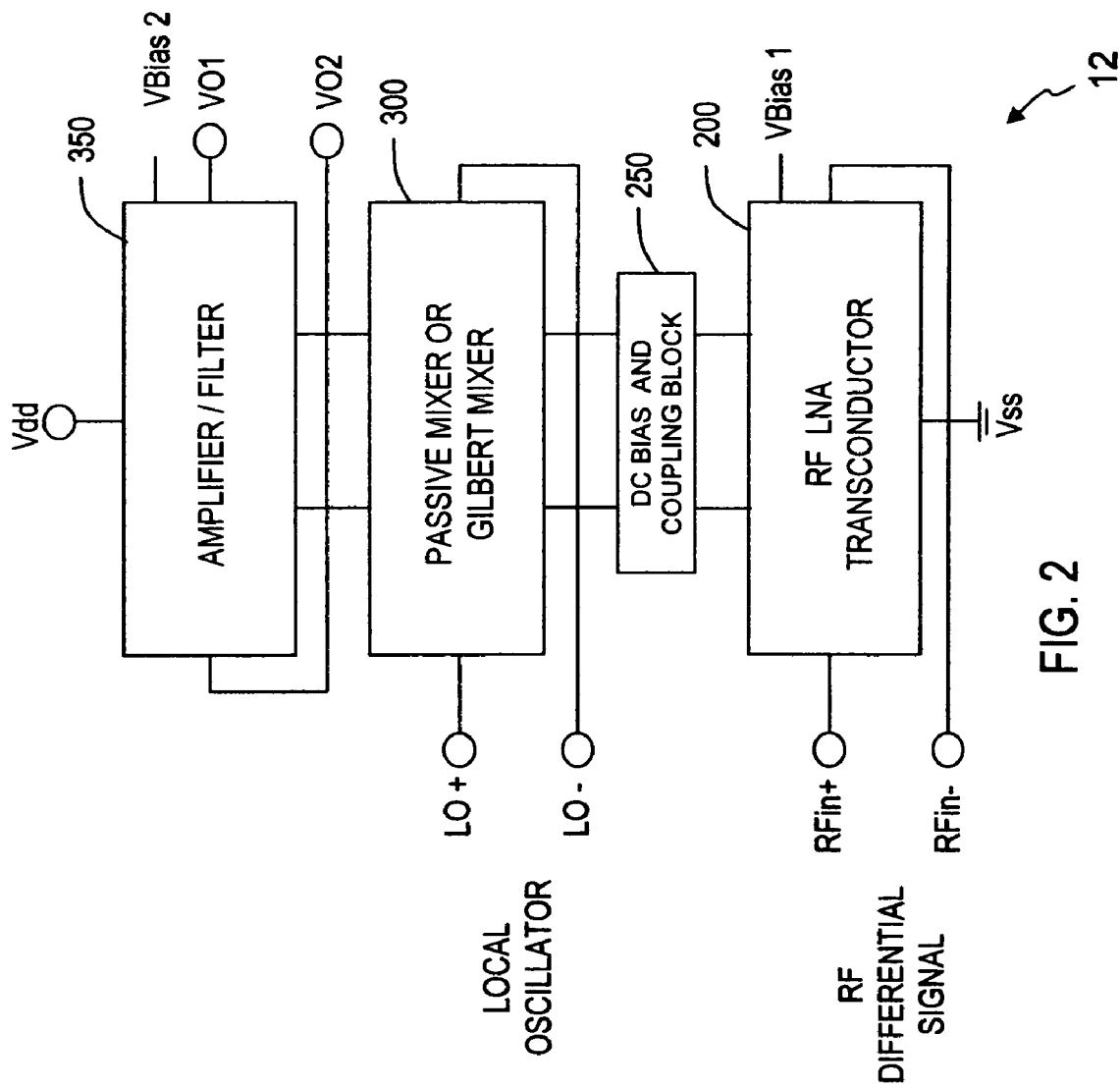
FIG. 2 is a block diagram of a portion of the receiver having a differential Low Noise Amplifier (LNA) transconductor meshed with a mixer and an amplifier/filter.

FIG. 2 is a block diagram of a portion of receiver 12 having a differential Low Noise Amplifier (LNA) transconductor 200 that is meshed or interconnected with a mixer 300 and an amplifier/filter 350. Transconductor 200 converts a voltage potential to a current. The configuration is compatible with building a radio on a digital CMOS process for low cost, and enhances embedding the radio with a baseband processor to achieve a high level of integration. The particular architecture shown in FIG. 2 allows a multiplicity of low-cost and low power receivers well-suited for Multiple-input Multiple-Output (MIMO) systems.

LNA transconductor 200 may receive differential signals, or alternatively, LNA transconductor 200 may receive a single-ended Radio Frequency (RF) signal from the antenna(s). In the embodiment where differential signals are received, the modulated signal may be converted to differential RF signals, for example, by a balanced filter, a balun, a single-to-differential transformer, or other method. The differential signals to LNA transconductor 200 are labeled RFin+ and RFin−, with differential signaling employed in the architecture to provide Vss and Vdd noise rejection, and a push-pull drive for a balanced mixer. Note that the method used to convert the modulated RF signal to differential signals is not a limitation of the present invention. In the embodiment where a single-ended RF signal is received, the modulated signal from the antenna is supplied to one input of LNA transconductor 200 and a capacitor (not shown) couples the other input to ground.

Signals from LNA transconductor 200 are coupled through a Direct Current (DC) bias and coupling block 250 to a mixer 300. The elements selected in block 250 provide the DC biasing for LNA transconductor 200 and the coupling of the differential output signals from LNA transconductor 200 to mixer 300. Note that different elements such as, for example, resistors, inductors and capacitors may be selected dependent upon the type of mixer that is incorporated in receiver 12.

Mixer 300 receives push-pull, complementary signals from LNA transconductor 200. In one embodiment mixer 300 may be a passive mixer having two differential transistor pairs of CMOS transistors, where the transistors operate in the triode region and act as switches. In another embodiment, mixer 300 may be a Gilbert mixer that also has two differential transistor pairs of MOS transistors, but in this embodiment the transistors are biased to operate in the saturation region, i.e., the drain-to-source voltage ($V_{DS}$) is not equal to zero and the DC current is not equal to zero. One skilled in the art would be able to supplement the two differential transistor pairs of CMOS transistors in the passive mixer with additional devices to provide the proper biasing for a Gilbert mixer. Thus, mixer 300 may be either a passive mixer or a Gilbert mixer that is incorporated with LNA transconductor 200 in the present invention.

Amplifier/filter 350 receives differential baseband output signals from mixer 300 and provides both linear amplification and filtering in generating the differential output signals Vo1 and Vo2. Amplifier/filter 350 may include filters having at least one pole in its transfer curve to filter blockers. By way of example, the filters included in amplifier/filter 350 may have a pole frequency in the transfer function at about 50 KHz, although this pole frequency is not a limitation of the present invention and other pole frequencies may be used. Amplifier/filter 350 may be implemented with a one pole role-off to provide a low pass filter, but may also have multiple poles and even zeros. Amplifier/filter 350 may include cascaded filters.

Figure 3:
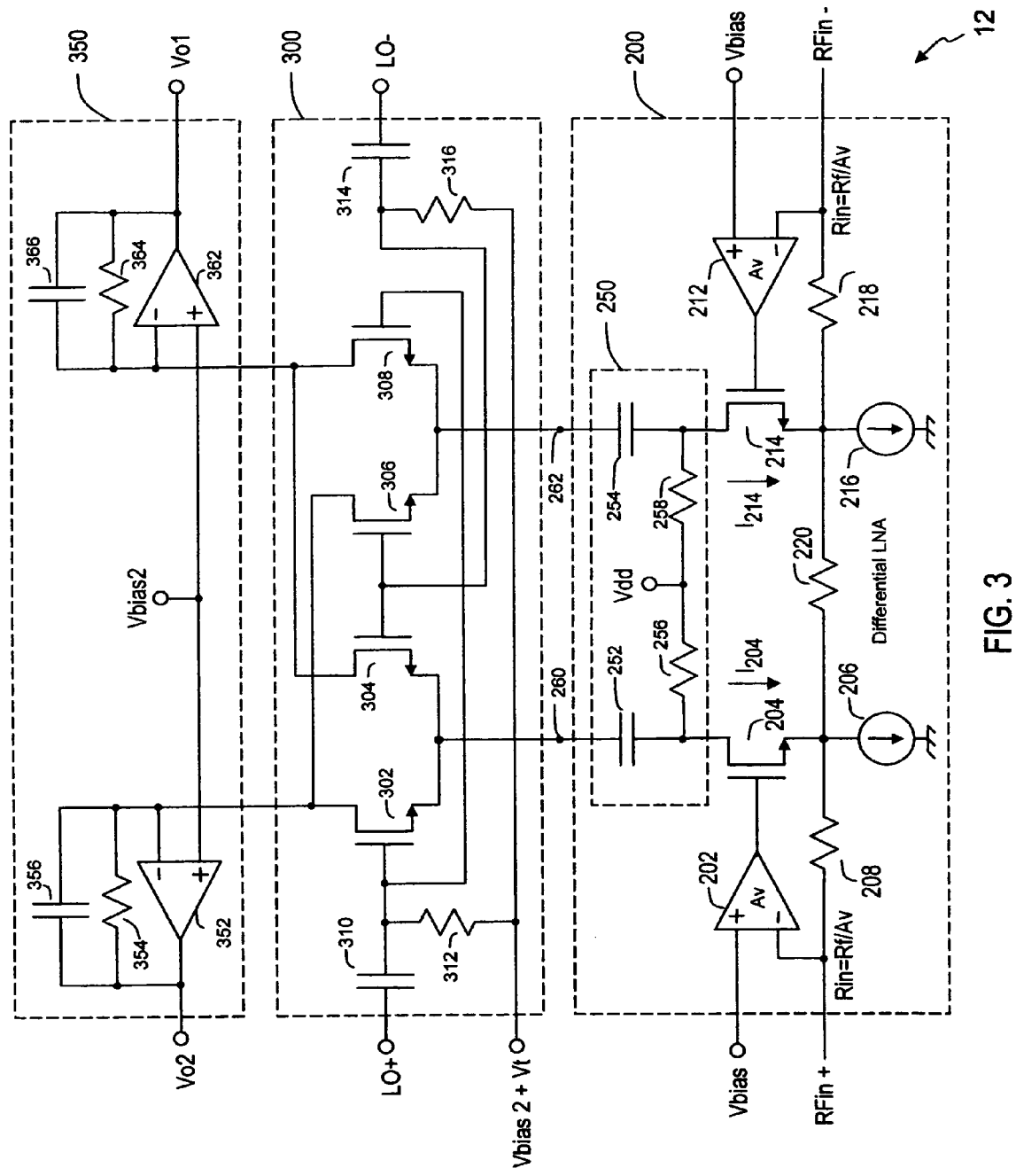
FIG. 3 is schematic diagram that illustrates one embodiment of the receiver front end illustrated in the block diagram in FIG. 2.

FIG. 3 is schematic diagram that illustrates one embodiment of the receiver front end illustrated in the block diagram in FIG. 2. The low-noise, high-linearity transconductor 200 is a merged function broadband LNA employing feedback, and whose output is a current rather than a voltage. LNA transconductor 200 includes two transconductor amplifiers that convert an input voltage represented by signals RFin+ and RFin− to an output current. Thus, the first transconductor amplifier receives the signal RFin+ at the input terminal and in response conducts a current I204 in transistor 204. A second transconductor amplifier receives the signal RFin− at the input terminal, and in response conducts a current $I_{214}$ in transistor 214.

It should be pointed out that FIG. 3 illustrates the generation of the in-phase signal component referred to as the "I" component. The quadrature component, referred to as the "Q" component, may be generated using the configuration described in the figure after replacing the local oscillator signals with signals phase shifted by ninety degrees. However, other methods understand by a person skilled in the art may be used to generate the quadrature component.

In the described embodiment, DC bias and coupling block 250 includes resistors 256 and 258 that are connected to a Vdd power conductor to provide bias to the respective drains of transistors 204 and 214. Resistors 256 and 258 may have relatively high resistance values to provide low noise. Capacitors 252 and 254 couple the complementary, out-of-phase signals from the drains of transistors 204 and 214 to nodes 260 and 262 as the inputs of mixer 300.

As shown, mixer 300 is a low noise, passive mixer arranged to have low flicker noise as well as low broadband noise. Mixer 300 includes two differential transistor pairs of CMOS transistors to steer the currents received from DC bias and coupling block 250. More particularly, transistors 302 and 304 are connected as a first differential transistor pair, wherein source terminals of these transistors are commonly connected to each other and to node 260. Transistors 306 and 308 are connected as a second differential transistor pair, wherein source terminals of these transistors are commonly connected to each other and to node 262. The gates of transistors 302 and 308 are commonly connected to a capacitor 310 to receive a local oscillator signal LO+. Similarly, the gates of transistors 304 and 306 are commonly connected to a capacitor 314 to receive a local oscillator signal LO−. The gates of transistors 302 and 308 are biased by resistor 312 to a voltage potential of approximately Vbias2+Vt to keep the transistors at the onset of conduction, where Vt is the threshold voltage of transistors 302, 304, 306 and 308. The gates of transistors 304 and 306 are biased by resistor 316 also to a voltage potential of approximately Vbias2+Vt.

Amplifier/filter 350 is shown as a low Zin baseband amplifier/filter, and in particular, as a shunt-shunt feedback amplifier. A first amplifier 352 is connected to the drain terminals of transistors 302 and 306, and employs a resistor 354 and a capacitor 356 in the feedback loop. A second amplifier 362 is connected to the drain terminals of transistors 304 and 308, and employs a resistor 364 and a capacitor 366 in the feedback loop. The first and second amplifiers may be high frequency op amps, or alternatively, feedback amplifiers with a common gate input stage. The first and second amplifiers may have a gain in the range of about 50-70 dB, although a gain in this range is provided as an example and additional gain is available by adding another amplifier stage at the outputs of the shown amplifiers.

In operation, the present invention provides a low-noise, high-linearity front end for use in cognitive radios, software defined radios, cell phones, radios that operate in Wide Area Networks (WAN) and/or Ultra-WideBand (UWB) networks, Wireless Local Area Network (WLAN) and radios which are exposed to a large number of in-band and out-of-band blockers/interferers. As presented in FIGS. 2 and 3, the analog front end consists of a low-noise, high-linearity transconductor, a mixer and a low input impedance baseband amplifier. Typically, in full duplex receivers such as CDMA and WCDMA a filter between the LNA and mixer may be eliminated in accordance with this invention. For instance, the external Surface Acoustic Wave (SAW) or the Bulk Acoustic Wave (BAW) filter typically found in full duplex prior art receivers may be eliminated to save money and reduce the size of the receiver in accordance with features of the present invention.

Whereas, in prior art receivers the linearity of the front end is typically determined by the linearity of the transconductor in the mixer, the present invention improves linearity by eliminating the transconductor in the mixer. The present invention merges the transconductor with the LNA to improve linearity and uses the high-linearity transconductor 200 to drive mixer 300 directly. LNA tranconductor 200 may be thought of as one unit or a merged unit whose linearity is almost the same as the LNA alone. This architecture insures that the combined linearity of LNA transconductor 200 and mixer 300 is substantially that of the transconductor, i.e., LNA transconductor 200.

Furthermore, terminating the output of mixer 300 into a low impedance Zin amplifier/filter 350 further enhances the noise figure and linearity of the mixer. The low input impedance at the output of mixer 300 provided by the input of amplifier/filter 350 also contributes to improved linearity, particularly for the passive mixer embodiment. Note that unlike prior art mixers that may require off-chip capacitors of high magnitude, the present invention facilitates the implementation of a low pass filter with moderate size capacitors that may be implemented on the integrated circuit.

Again, prior art CDMA and WCDMA receivers typically include a signal path having a LNA connected to the antenna that is followed by a filter and then a mixer. The filter may be a SAW, BAW or passive filter that allows the wireless device to operate in a full duplex mode where the receiver and transmitter may operate simultaneously. The filter provides an improvement in signal linearity, but the SAW or BAW filter cost may be substantial. It should be pointed out that the receiver 12 shown in FIGS. 2 and 3 has a LNA transconductor 200 that is followed by mixer 300, and thus, the present invention has a signal path that eliminates the filter in the prior art between the LNA and the mixer.

Thus, wireless device 10 includes a LNA transconductor 200 that is meshed or interconnected with a mixer 300 and an amplifier/filter 350 to demodulate a received RF signal. A Local Oscillator provides a stable frequency signal labeled LO for frequency down-converting the RF signal. Accordingly, receiver 12 may be used as a direct-conversion front-end receiver to demodulate the received RF signal to the baseband signal, or alternatively, receiver 12 may convert the received RF signal to an Intermediate Frequency (IF) or a low IF signal, whereby an Analog-to-Digital (A/D) converter and digital circuitry may then further convert that analog signal from IF to a digital baseband signal. By way of example, the signal LO may operate at a frequency in the GigaHertz (GHz) range and translate the carrier frequency of the RF signal to an intermediate frequency of about 200 MHz or about 100 KHz for a low IF signal.

By now it should be apparent that the present invention provides an architectural approach for a receiver applicable to a low cost CMOS radio having high linearity and sensitivity. By incorporating the described architecture the prior art filter between the LNA and mixer in a full duplex receiver may be eliminated, resulting in a small die area while providing low noise figure CMOS radio products with low power. Further, embodiments of the present invention are particularly useful in pure digital CMOS technology and in MIMO systems.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A wireless device having a receiver coupled to an antenna, comprising:
    a Low Noise Amplifier (LNA) transconductor to receive a signal from the antenna, wherein the LNA transconductor includes an amplifier driving a control input of a transistor, where a first input of the amplifier receives the signal from the antenna and a second input receives a bias voltage potential;
    a mixer meshed with the LNA transconductor;
    an amplifier/filter meshed with the mixer to provide a baseband output signal; and
    a feedback resistor coupled between the first input of the amplifier and a conduction terminal of the transistor.

2. The wireless device of claim 1 wherein another conduction terminal of the transistor provides a signal to the mixer.

3. The wireless device of claim 2 wherein the another conduction terminal of the transistor is coupled to source terminals of a first differential transistor pair in the mixer.

4. The wireless device of claim 3 wherein the amplifier/filter includes an amplifier having an input coupled to a drain of one transistor in the first differential transistor pair, another input to receive a bias voltage potential, and a parallel connected resistor and capacitor in a feedback loop.

5. The wireless device of claim 1 wherein the LNA transconductor includes an amplifier driving a gate of a Metal Oxide Semiconductor Field Effect Transistor (MOSFET).

6. The wireless device of claim 1 wherein the mixer is a passive mixer.

7. The wireless device of claim 1 wherein the mixer is a Gilbert mixer.

8. The wireless device of claim 1 wherein the amplifier/filter has a low input impedance.

9. The wireless device of claim 1 wherein the LNA transconductor, the mixer and the amplifier/filter are interconnected together to receive a modulated Radio Frequency (RF) signal by the LNA transconductor and frequency down convert to a baseband signal provided at outputs of the amplifier/filter.

10. The wireless device of claim 9 further including embedded first and second cores in the wireless device, wherein the outputs of the amplifier/filter are converted to a digital signal and provided to at least one of the first and second cores.

11. The wireless device of claim 1 wherein the LNA transconductor, the mixer and the amplifier/filter are interconnected together to receive a modulated Radio Frequency (RF) signal by the LNA transconductor and frequency down convert to an intermediate frequency signal provided at outputs of the amplifier/filter.

12. A wireless device comprising:
    a receiver to demodulate an RF signal received by the wireless device and provide a baseband signal, wherein the receiver includes
        a Low Noise Amplifier (LNA) transconductor to receive the RF signal, wherein the LNA transconductor includes a first amplifier driving a gate of a first transistor and a second amplifier driving a gate of a second transistor, the first and second amplifiers having inputs to receive the RF signal,
        a mixer meshed with the LNA transconductor, and
        an amplifier/filter meshed with the mixer to provide the baseband signal;
    a first resistor coupled between an input of the first amplifier and a source of the first transistor;
    a second resistor coupled between an input of the second amplifier and a source of the second transistor;
    a third resistor coupled between the source of the first transistor and the source of the second transistor;
    an analog-to-digital (AID) converter coupled to the receiver to provide a digital signal; and
    first and second embedded processor cores, where at least one of the embedded processor cores processes the digital signal.

13. The wireless device of claim 12 wherein the mixer includes first and second differential transistor pairs, the first differential transistor pair having commonly connected sources coupled to a drain of the first transistor and the second differential transistor pair having commonly connected sources coupled to a drain of the second transistor.

14. The wireless device of claim 12 wherein the amplifier/filter includes:
    a first amplifier having a first parallel connected resistor and capacitor in a feedback loop between an input and an output; and
    a second amplifier having a second parallel connected resistor and capacitor in a feedback loop between an input and an output.

15. The wireless device of claim 12 wherein the amplifier/filter has a low input impedance.

\* \* \* \* \*